US010557872B2

(12) United States Patent
Gopfert et al.

(10) Patent No.: US 10,557,872 B2
(45) Date of Patent: Feb. 11, 2020

(54) MEASURING ARRANGEMENT AND METHOD FOR CONTACTLESS ELECTRIC CURRENT MEASUREMENT

(71) Applicant: Testo AG, Lenzkirch (DE)

(72) Inventors: Dirk Gopfert, Ihringen (DE); Nebojsa Nesovic, Denzlingen (DE); Jorg Volger, Denzlingen (DE)

(73) Assignee: Testo AG, Lenzkirch (DE)

( * ) Notice: Subject to any disclaimer, the term of this patent is extended or adjusted under 35 U.S.C. 154(b) by 109 days.

(21) Appl. No.: 15/196,520

(22) Filed: Jun. 29, 2016

(65) Prior Publication Data
US 2017/0003324 A1    Jan. 5, 2017

(30) Foreign Application Priority Data

Jun. 30, 2015   (DE) .......................... 10 2015 008 516

(51) Int. Cl.
*G01R 15/18* (2006.01)
(52) U.S. Cl.
CPC ........... *G01R 15/181* (2013.01); *G01R 15/18* (2013.01)
(58) Field of Classification Search
None
See application file for complete search history.

(56) References Cited

U.S. PATENT DOCUMENTS

| | | | | |
|---|---|---|---|---|
| 5,012,218 A * | 4/1991 | Haug | ................... | G01R 15/181 324/127 |
| 5,057,769 A * | 10/1991 | Edwards | .............. | G01R 15/181 324/107 |
| 5,107,212 A * | 4/1992 | Dobler | ................. | G01D 5/2208 324/207.16 |
| 5,617,019 A | 4/1997 | Etter | | |
| 7,164,263 B2 * | 1/2007 | Yakymyshyn | ....... | G01R 15/207 324/117 H |
| 2003/0112000 A1 | 6/2003 | Sorenson, Jr. | | |
| 2006/0113987 A1 * | 6/2006 | Sorensen | ............. | G01R 15/148 324/117 H |
| 2010/0207603 A1 * | 8/2010 | McNulty | .............. | G01R 15/181 324/127 |
| 2014/0210463 A1 * | 7/2014 | Klein | ................. | G01R 33/0052 324/253 |

FOREIGN PATENT DOCUMENTS

| | | |
|---|---|---|
| CN | 103575968 | 2/2014 |
| EP | 2589971 | 5/2013 |

OTHER PUBLICATIONS

Verho, Jarmo; Device and coil arrangement for measuring magnetic particles and corresponding method; Internation Publication Date:Dec. 4, 2008; Magnasense OY; WO 2008/145813 A1; G01N27/72.*
Chinese Office Action dated Jul. 31, 2019, in Chinese Application No. 201610824343.9, 9 pages.
English Translation of Chinese Office Action dated Jul. 31, 2019, in Chinese Application No. 201610824343.9, 10 pages.

* cited by examiner

*Primary Examiner* — Nasima Monsur
(74) *Attorney, Agent, or Firm* — Volpe and Koenig, P.C.

(57) ABSTRACT

In a measuring arrangement (1) for contactless electric current measurement, it is provided to detect a common signal of a measuring coil arrangement (2) and a compensating coil arrangement (3) by a first detection device (4) and to detect a signal from at least one measuring coil (6, 7) of the measuring coil arrangement (2) separately therefrom by a second detection device (5, 23).

16 Claims, 2 Drawing Sheets

MEASURING ARRANGEMENT AND METHOD FOR CONTACTLESS ELECTRIC CURRENT MEASUREMENT

INCORPORATION BY REFERENCE

The following documents are incorporated herein by reference as if fully set forth: German Patent Application No. DE 102015008516.6, filed Jun. 30, 2015.

BACKGROUND

The present invention relates to a measuring arrangement for contactless measurement of electric currents by a measuring coil arrangement and a compensating coil arrangement, wherein a common signal of the measuring coil arrangement and the compensating coil arrangement is detectable by a first detection device.

The invention furthermore relates to a method for contactless electric current measurement in an electric conductor, wherein a signal is generated in a measuring coil arrangement by induction from the electric conductor and the measuring coil arrangement has assigned to it a compensating coil arrangement.

It is known to carry out contactless electric current measurements using so-called current clamps, in which an openable, ring-shaped core is placed around an electric conductor and a magnetic field of the electric conductor is received and inductively measured by the core. Here, the ring-shaped core must be opened and closed for each measurement, which may be complicated if many electric conductors are intended to be measured and/or if the electric conductors are difficult to access.

It is advantageous for the core or the coil to describe a closed ring around the electric conductor for a measurement which is free from interference by externally generated magnetic fields, i.e. magnetic fields generated outside of the electric conductor.

Coil arrangements which deviate herefrom and which have compensating coils for compensating interference fields are also known. In these arrangements, a common signal induced in the measuring coil and in an assigned compensating coil is detected and evaluated.

SUMMARY

The invention is based on the object of improving the usage properties of a measuring arrangement for a contactless electric current measurement.

One or more features according to the invention are provided for achieving the aforementioned object. Hence, in the case of a measuring arrangement of the type set forth at the outset, it is provided according to the invention that, in particular, a signal of at least one measuring coil of the measuring coil arrangement is detectable by a second detection device. What is advantageous here is that it is possible to provide a second measurement variable in addition to the measurement variable physically compensated by compensating coils. A measurement result for the first measurement variable is once again improvable by way of this second measurement variable. With the second measurement variable, it is alternatively, or additionally, possible to carry out a plausibility check of the measurement situation by virtue of e.g. the second (uncompensated) measurement variable being comparable to the first (compensated) measurement variable and being compared thereto. The invention therefore enables the improvement of the measurement accuracy in the case of a fork-shaped, rigid measuring arrangement. This improves the usage properties since it is possible to dispense with opening and closing of a ring-shaped core for the purposes of the measurement.

In an advantageous refinement, provision can be made for the measuring coil arrangement to have a first measuring coil and a second measuring coil. Hence, an alternative to a single, e.g. U-shaped, measuring coil is provided. In particular, provision can be made in this case for the first measuring coil and the second measuring coil to be arranged on mutually opposite sides or on both sides of an electric conductor receptacle. What is advantageous here is that a magnetic field of the electric conductor is detectable on both sides of the electric conductor.

In an advantageous refinement, provision can be made for a, in particular each, measuring coil of the measuring coil arrangement to have electrically assigned thereto at least one compensating coil of the compensating coil arrangement. By way of example, the electric assignment can render possible that a voltage induced in the measuring coil and a voltage induced in the at least one compensating coil add with the correct sign and that external interference influences are thus illuminated. Hence, a compensation of external interference fields is easily achievable by physical means. In particular, the, or each, measuring coil has electrically assigned thereto two compensating coils. The use of two compensating coils per measuring coil enables a once again increased suppression of external interference fields, for example from an adjacent electric conductor which is not intended to be measured.

In an advantageous refinement, provision can be made for the compensating coils assigned to a measuring coil to be arranged at in each case one end of the measuring coil. As a result of this measure, a particularly good approximation of a measuring coil surrounding the electric conductor in a ring-shaped manner is achievable.

In so doing, or as an alternative, provision can be made for the compensating coils assigned to a measuring coil to be aligned at an angle of between 45° and 135° in relation to the measuring coil. Here, it is advantageous that a voltage is automatically induced in the compensating coils, which voltage compensates a voltage induced in the measuring coil for an electric conductor lying outside of an electric conductor receptacle defined or described by the measuring coil arrangement. This effect can be achieved in an ever improved manner, the more the angle approaches 90°. Therefore, the angle preferably lies between 80° and 100°. Particularly preferably, the angle therefore is approximately 90°, for example within the scope of a manufacturing accuracy or manufacturing tolerances, or it is even exactly 90°.

In an advantageous refinement, provision can be made for the first detection device and the second detection device each to have an amplification member. Here, it is advantageous that signals obtained independently from one another are providable and further processable.

In an advantageous refinement, provision can be made for a digital signal processing device to be connected in each case to the first detection device and the second detection device. Here, it is advantageous that further processing is performable by a Fast Fourier Transform (FFT). This allows simple filtering and adjustment to a frequency of a current to be measured.

In an advantageous refinement, provision can be made for a signal of a first measuring coil, e.g. the already mentioned first coil, of the measuring coil arrangement to be detectable by means of the second detection device and a signal of a second measuring coil, e.g. the already mentioned second coil, of the measuring coil arrangement to be detectable by a third detection device. Hence it is possible to distinguish whether an external electric conductor is arranged on the side of the first measuring coil or of the second measuring coil.

In an advantageous refinement, provision can be made for the compensating coils of the compensating coil arrangement to have substantially identical, e.g. up to manufacturing tolerances or up to differences negligible for a sought-after measurement accuracy, or even exactly identical cross sections, winding densities and/or number of turns. Here, it is advantageous that the design of the coils for compensating the external interference fields is easily establishable and realizable. By way of example, the tolerated deviations can be less than 10% of the respective nominal value, in particular less than 5% of the respective nominal value.

In an advantageous refinement, provision can be made for the measuring coils of the measuring coil arrangement to have substantially identical, e.g. up to manufacturing tolerances or up to differences negligible for a sought-after measurement accuracy, or even exactly identical cross sections, winding densities and/or number of turns. Here, it is advantageous that the measuring coils are matched to one another and easily compensable. By way of example, the tolerated deviations can be less than 10% of the respective nominal value, in particular less than 5% of the respective nominal value.

In an advantageous refinement, provision can be made for a number of turns of at least one measuring coil of the measuring coil arrangement to be greater than a number of turns of at least one assigned compensating coil of the compensating coil arrangement. Hence, the actual measurement signal is generable in the measuring coil, said measurement signal being compensated where necessary by the induced voltage of the compensating coils. Preferably, the number of turns of each measuring coil is substantially equal, for example within the scope of the measurement accuracy of the current measurement, or even exactly equal to the sum of the number of turns of the assigned compensating coils.

In an advantageous refinement, provision can be made for the measuring coils and the compensating coils to be arranged in a mesh connected to the first detection device. Here, it is advantageous that the induced voltages of the measuring coils and the compensating coils are physically added before the compensated signal is detected by the first detection device.

In an advantageous refinement, provision can be made for the winding directions of the measuring coils and of the compensating coils to correspond. Hence, a physical compensation of induced voltages from external electric conductors is easily achievable.

In an advantageous refinement, provision can be made for the measuring coils and/or the compensating coils to be embodied as air coils. Hence, it is possible to dispense with the use of core material.

In an advantageous refinement, provision can be made for the measuring coil arrangement and/or the compensating coil arrangement to define an electric conductor receptacle, e.g. the aforementioned electric conductor receptacle, for an electric conductor to be measured. Here, it is advantageous that the measuring coil arrangement therefore defines a sensitive region, in which a current of an electric conductor is measurable, while electric conductors arranged outside of the electric current receptacle are suppressed. In particular, provision can be made here for the electric conductor receptacle to be defined and embodied between a first measuring coil, e.g. the aforementioned first measuring coil, of the measuring coil arrangement and a second measuring coil, e.g. the aforementioned second measuring coil, of the measuring coil arrangement. Hence, an arrangement of the measuring coils which is symmetric or restricts the electric current receptacle to the outside is provided.

It is particularly advantageous here if the electric current receptacle has a fork-shaped and/or rigid embodiment, in particular without movable parts. Hence, it is possible to provide a measuring arrangement which is particularly easy to handle and/or mechanically robust.

In an advantageous refinement, provision can be made for the measuring coil arrangement and/or the compensating coil arrangement each to be arranged in a spatially mirror-symmetric manner. Hence, a simple arrangement is provided, for which a virtually complete compensation of external influences on a measurement is achievable in a particularly simple manner. Preferably, a mirror plane of the mirror symmetry is arranged centrally in relation to an electric current receptacle, e.g. the aforementioned electric current receptacle.

In an advantageous refinement, provision can be made for the measuring coil arrangement and the compensating coil arrangement to be matched in such a way that the sum of the magnetic flux in the measuring coils and in the compensating coils equals zero for an electric conductor lying outside of an, or the, electric conductor receptacle. Hence, an influence of an external electric conductor on a current measurement can be practically eliminated.

In an advantageous refinement, provision can be made for a measuring error recognition device to be configured to compare, firstly, the signals from the first measuring coil and/or second measuring coil with, secondly, the common signal of the measuring coil arrangement and the compensating coil arrangement. Hence, a plausibility check can easily be carried out since only an external electric conductor generates an uncompensated signal in the measuring coil which is greater than the compensated signal. It is therefore easily recognizable that a measuring error is present if the (only) electric conductor to be measured lies outside of the electric conductor receptacle. In particular, provision can be made here for the measuring error recognition device to be configured to output a measuring error notification if the common signal is less than the signal of the first measuring coil and/or the second measuring coil. This allows the user to easily identify measuring errors and, for example, avoid these by repeated measurements.

In an advantageous refinement, provision can be made for an activation apparatus to be configured to detect a signal of the measuring coil arrangement and/or of the compensating coil arrangement and to activate a further component for processing and/or outputting a measured value of the measuring coil arrangement if the signal satisfies a stored criterion. Hence, additional operating steps for activating the measuring arrangement are dispensable. By way of example, this can be configured by polling, i.e. by regular querying, as to whether the signals of the measuring coil arrangement provided and/or obtained according to the invention indicate an inserted electric conductor. By way of example, the stored criterion can be a threshold for a voltage in the measuring coil being exceeded and/or a result of a comparison of the common signal of the measuring coil arrangement and the compensating coil arrangement with the signal of the at least one measuring coil. By way of example, an activation can take place when the voltage in the measuring coil arrangement or the compensated voltage exceeds a threshold and the voltage in the measuring coil arrangement moreover is not greater than the compensated voltage.

In an advantageous refinement, provision can be made for a measuring range switching device to be configured to switch from processing the common signal of the measuring coil arrangement and the compensating coil arrangement to only processing the signal from the measuring coil arrangement when the signal exceeds a threshold. Here, it is advantageous that the measuring coil(s) are usable without compensation for large currents and the compensated measuring coils are usable for small currents, in which external interference fields can cause a larger relative error, with additional operating steps, for example for switching between the measuring range, being dispensable.

To achieve the aforementioned object, provision is made, in a method, for the one or more features of the invention directed to a method. Hence, in particular, in order to achieve the object in a method of the type set forth at the outset, it is provided, according to the invention, that a common signal of the measuring coil arrangement and the compensating coil arrangement is detected and that a signal of at least one measuring coil of the measuring coil arrangement is additionally detected. Hence, a second, independent signal is obtained which enables an assessment of the measurement situation, an activation of a measurement and/or an improved accuracy of the measurement. As a result of this, respectively improved usage properties emerge in the current measurement.

In an advantageous refinement, provision can be made for a measuring error notification to be output if the common signal is less than the signal of the at least one measuring coil. Here, it is advantageous that a measurement of an external electric conductor is easily distinguished from a measurement of an electric conductor inserted into an electric conductor receptacle.

In an advantageous refinement, provision can be made for a switch to be made from an evaluation of the common signal to an evaluation of the signal from the at least one measuring coil if the signal exceeds a threshold. Here, it is advantageous that an automatic measuring range switch is carried out. Additional operating steps by a user are dispensable.

In an advantageous refinement, provision can be made for use to be made of a measuring arrangement according to the invention, in particular as described above and/or according to one of the claims directed to a measuring arrangement.

BRIEF DESCRIPTION OF THE DRAWINGS

The invention will now be described in more detail on the basis of an exemplary embodiment, but it is not restricted to this exemplary embodiment. Further exemplary embodiments emerge by combining the features of individual claims or of a plurality of claims amongst themselves and/or with individual features or a plurality of features from the exemplary embodiment.

In a much simplified illustration.

DETAILED DESCRIPTION OF THE PREFERRED EMBODIMENTS

Figure 1:
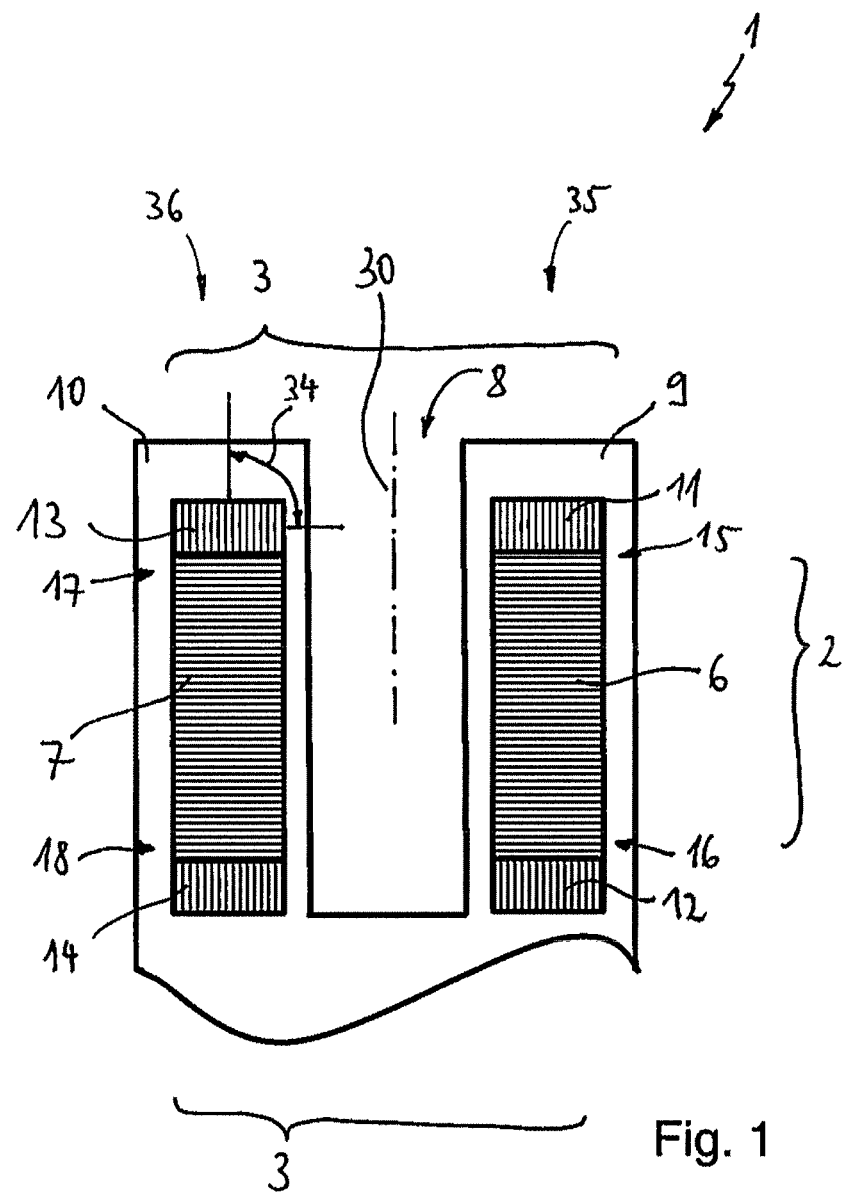
FIG. 1 shows a portion of a measuring arrangement according to the invention.

FIG. 1 shows, in a much simplified illustration, the front part of a measuring arrangement according to the invention, denoted as a whole by 1, for contactless electric current measurement.

In order to simplify the illustration, the handle of the measuring arrangement 1, which has the evaluation electronics, an output for measured values, for example a display, and operating elements, is not depicted in any more detail.

The measuring arrangement 1 according to the invention has a measuring coil arrangement 2 and a compensating coil arrangement 3.

Figure 2:
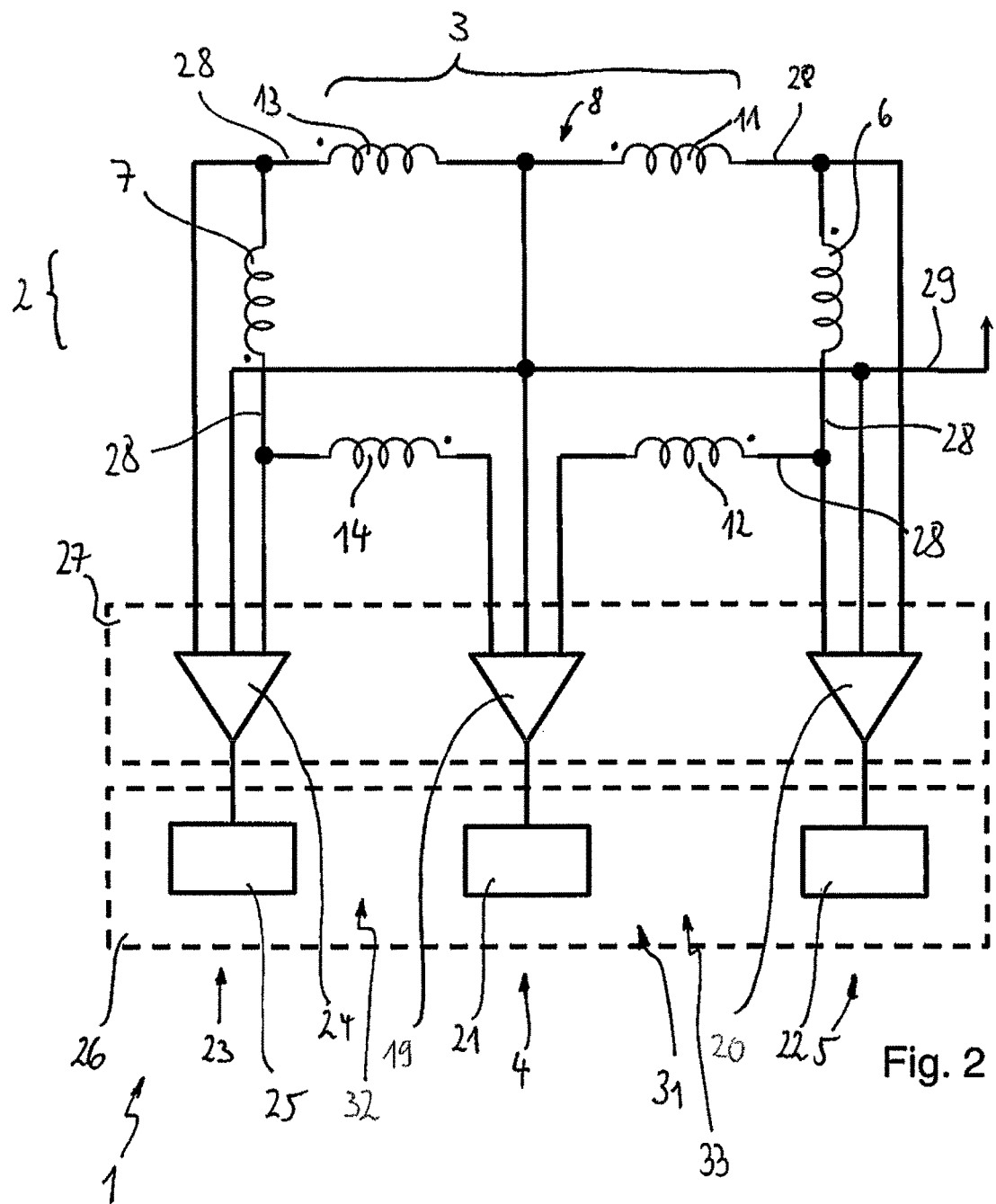
FIG. 2 shows an interconnection, according to the invention, of the measuring arrangement according to FIG. 1.

FIG. 2 shows the associated interconnection.

Accordingly, the measuring arrangement 1 has a first detection device 4, by which a signal of the measuring coil arrangement 2 and of the compensating coil arrangement 3 is detectable.

Furthermore, the measuring arrangement 1 has a second detection device 5, by which a signal of a first measuring coil 6 of the measuring coil arrangement 2 is detectable separately from the compensating coil arrangement 3.

The measuring coil arrangement 2 has a second measuring coil 7. The first measuring coil 6 and the second measuring coil 7 are arranged on both sides on mutually opposing sides 35, 36 of a fork-shaped electric conductor receptacle 8.

The electric conductor to be measured is insertable into the electric conductor receptacle 8.

The electric conductor receptacle 8 is embodied in rigid fashion without movable parts.

Therefore, the measuring coils 6, 7 are respectively arranged in a fork tooth 9, 10.

The compensating coil arrangement 3 has four compensating coils 11, 12, 13, 14.

From FIG. 2, it is clear that the compensating coils 11, 12 are electrically assigned to the first measuring coil 6 while the compensating coils 13, 14 are electrically assigned to the second measuring coil 7.

In the illustration in accordance with FIG. 1, it is clear that in each case one compensating coil 11, 12, 13, 14 is arranged at each measuring coil 6, 7 at the ends 15, 16, 17, 18 thereof.

Here, each compensating coil 11, 12, 13, 14 is aligned at an angle 34 of 90° in relation to the respectively assigned measuring coil 6, 7.

The first detection device 4 has an amplification member 19 and a digital signal processing device 21 downstream thereof.

The second detection device 5 equally has an amplification member 20 and a digital signal processing device 22 downstream thereof.

Furthermore, the measuring arrangement 1 has a third detection device 23, by means of which a signal from the second measuring coil 7 of the measuring coil arrangement 2 is detectable separately from the compensating coil arrangement 3 and the first measuring coil 6.

The third detection device 23 analogously has an amplification member 24 and a digital signal processing device 25 downstream thereof.

The digital signal processing devices 21, 22, 25 are part of a digital signal processing unit 26, while the amplification members 19, 20, 24 are part of a signal amplification unit 27.

The compensating coils 11, 12, 13, 14 have an identical embodiment in relation to one another and therefore have corresponding cross sections, winding densities and numbers of turns.

The measuring coils 6, 7 have an identical embodiment in relation to one another and therefore have corresponding cross sections, winding densities and numbers of turns.

The numbers of turns of the measuring coils 6, 7 are in each case greater than the numbers of turns of the compensating coils 11, 12, 13, 14.

Here, the sum of the number of turns of the compensating coils 11, 12, 13, 14 of a measuring coil 6, 7 equals the number of turns of the respectively assigned measuring coil 6, 7.

The measuring coils 6, 7 and the compensating coils 11, 12, 13, 14 are arranged in a common mesh 28 and connected to the first detection device 4. It is clear from FIG. 2 that the measuring coil 6 and the assigned compensating coils 11, 12 have corresponding winding directions. Likewise, the measuring coil 7 and the assigned compensating coils 13, 14 have corresponding winding directions.

Moreover, the amplification members 19, 20, 24 are connected to a supply voltage 29.

The measuring coils 6, 7 and the compensating coils 11, 12, 13, 14 are in each case embodied as air coils without a core.

From FIG. 1, it is possible to see that the measuring coils 6, 7 define the electric conductor receptacle 8 therebetween, with the arrangement of the measuring coils 6, 7 and the arrangement of the compensating coils 11, 12, 13, 14 being embodied in a spatially mirror-symmetric manner in relation to a central plane 30 of the electric conductor receptacle 8.

The compensating coil arrangement 3 is matched to the measuring coil arrangement 2 in such a way that the sum of the magnetic flux in the measuring coils 6, 7 and in the compensating coils 11, 12, 13, 14 equals zero for an electric conductor lying outside of the electric conductor receptacle 8. Hence, magnetic fields which are generated by an electric conductor outside of the electric conductor receptacle 8 are compensated to just such an extent that no measuring signal is generated in the first detection device 4.

A measuring error recognition device 31 is embodied in the digital signal processing unit 26, by which measuring error recognition device the signals of the first measuring coil 6 and the second measuring coil 7 are comparable with one another, firstly, respectively on their own and, secondly, for the common signal of the measuring coil arrangement 2 and the compensating coil arrangement 3, i.e., firstly, the signals at the amplification members 20, 24 and, secondly, at the amplification member 19. The measuring error recognition device 31 is configured in such a way that a measuring error notification is output in the case where the common signal is less than the signal of the first measuring coil 6 or less than the signal of the second measuring coil 7. This ratio indicates that the electric conductor does not lie within the electric conductor receptacle 8 but rather lies outside of the electric conductor receptacle 8. The measuring error note therefore indicates that, possibly, the wrong electric conductor or even no electric conductor is detected in the electric conductor receptacle 8.

The digital signal processing unit 26 furthermore has an activation apparatus 32, by means of which at least one signal of the measuring coil arrangement 2 and the compensating coil arrangement 3 is detectable.

A further component for processing and/or outputting a measured value of the measuring coil arrangement is activated if the detected signals satisfy a criterion, according to which the signal at the first measuring coil 6 and/or the second measuring coil 7 exceeds/exceed a stored threshold and if, at the same time, this signal is not greater than the compensated voltage at the first detection device 4. As a result of this, the normal operation of the measuring arrangement 1 is switched on.

Furthermore, a measuring range switching device 33 is formed in the digital signal processing unit 26.

This measuring range switching device 33 is configured, firstly, for switching from processing the common signal at the first detection device 4 to processing the signal at the second detection device 5 and/or the third detection device 23. This occurs if the signal is strong enough to be able to carry out a current measurement using only the measuring coils 6, 7 without compensation.

Hence, a method for contactless current measurement can be carried out using the measuring arrangement 1 in a conductor through which current flows, wherein the conductor is inserted into the electric conductor receptacle 8.

Hence, an electric signal is generated by the measuring coil arrangement 2 by way of induction.

Additionally, an electric signal is likewise generated inductively in the compensating coil arrangement 3, wherein this signal at least partly compensates the signal of the measuring coil arrangement 2.

The common signal of the measuring coil arrangement 2 and the compensating coil arrangement 3, i.e. the compensated signal, is detected in the first detection device 4 and a signal of the measuring coil 6 and of the measuring coil 7 is respectively detected in the second detection device 5 and the third detection device 23, in each case on its own.

A measuring error notification is output to the extent that the signal of the measuring coil 6 or the signal of the measuring coil 7 is greater than the common signal at the first detection device 4, as the measured electric conductor then must lie outside of the electric conductor receptacle 8.

To the extent that the signal at one of the detection devices 4, 5, 23 exceeds a threshold, a switch is made from an evaluation of the common signal for obtaining the measured value to an evaluation of the individual signals of the measuring coil 6, 7.

What is used here is that the amplification members 20, 24 are set to a different measured value range than the amplification member 19, to which a compensated signal is applied.

Hence, by way of this switching measuring range, it is possible to carry out both the compensated measurement of an inserted electric conductor with a low current and the uncompensated measurement of an electric conductor with a high current.

In the measuring arrangement 1 for contactless electric current measurement, it is proposed to detect a common signal of a measuring coil arrangement 2 and a compensating coil arrangement 3 by a first detection device 4 and to detect a signal from at least one measuring coil 6, 7 of the measuring coil arrangement 2 separately therefrom by a second detection device 5, 23.

LIST OF REFERENCE SIGNS

1 Measuring arrangement
2 Measuring coil arrangement
3 Compensating coil arrangement
4 First detection device
5 Second detection device
6 First measuring coil
7 Second measuring coil
8 Electric conductor receptacle
9 Fork tooth
10 Fork tooth
11 Compensating coil
12 Compensating coil
13 Compensating coil
14 Compensating coil
15 End of 6
16 End of 6
17 End of 7

18 End of 7
19 Amplification member
20 Amplification member
21 Digital signal processing device
22 Digital signal processing device
23 Third detection device
24 Amplification member
25 Digital signal processing device
26 Digital signal processing unit
27 Signal amplification unit
28 Mesh
29 Supply connection
30 Central plane
31 Measuring error recognition device
32 Activation device
33 Measuring range switching device
34 Angle
35 Side of 8
36 Side of 8

The invention claimed is:

1. A measuring arrangement (1) for contactless electric current measurement, comprising:
   a measuring coil arrangement (2) having a first measuring coil (6) and a second measuring coil (7),
   a compensating coil arrangement (3) having a first compensating coil (11) connected to one end of the first measuring coil (6) and a second compensating coil (13) connected to one end of the second measuring coil (7),
   a first detection device (4) that detects common signals from the first and second measuring coils (6, 7) of the measuring coil arrangement (2) and the first and second compensating coils (11, 13) of the compensating coil arrangement (3),
   a second detection device (5) that separately detects a signal of the first measuring coil (6) of the measuring coil arrangement (2),
   an electric conductor receptacle (8),
   the first and second measuring coils are located on mutually opposite sides (35, 36) of the electric conductor receptacle (8), and
   the compensating coil arrangement (3) having a third compensating coil (12) and a fourth compensating coil (14), wherein the third compensating coil (12) being connected to an other end of the first measuring coil (6) from the first compensating coil (11), and the fourth compensating coil (14) being connected to an other end of the second measuring coil (7) from the second compensating coil (12).

2. The measuring arrangement (1) for contactless electric current measurement as claimed in claim 1, wherein the compensating coils (11, 12, 13, 14) assigned to each of the measuring coils (6, 7) include compensating coil axes and are aligned at an angle of between 45° and 135° in relation to axes of respective ones of the first and second measuring coils (6, 7).

3. The measuring arrangement (1) for contactless electric current measurement as claimed in claim 1, wherein the first detection device (4) and the second detection device (5) each have an amplification member (19, 20).

4. The measuring arrangement (1) for contactless electric current measurement as claimed in claim 1, further comprising a digital signal processing device (19, 20) connected in each case to the first detection device (4) and the second detection device (5).

5. The measuring arrangement (1) for contactless electric current measurement as claimed in claim 1, wherein the compensating coils (11, 12, 13, 14) of the compensating coil arrangement (3) have at least one of substantially identical cross sections, winding densities or number of turns.

6. The measuring arrangement (1) for contactless electric current measurement as claimed in claim 1, wherein the measuring coils (6, 7) of the measuring coil arrangement (2) have at least one of substantially identical cross sections, winding densities or number of turns.

7. The measuring arrangement (1) for contactless electric current measurement as claimed in claim 1, wherein a number of turns of at least one measuring coil (6, 7) of the measuring coil arrangement (2) is greater than a number of turns of at least one assigned compensating coil (11, 12, 13, 14) of the compensating coil arrangement.

8. The measuring arrangement (1) for contactless electric current measurement as claimed in claim 1, wherein the measuring coils (6, 7) and the compensating coils (11, 12, 13, 14) are arranged in a mesh (28) connected to the first detection device (4).

9. The measuring arrangement (1) for contactless electric current measurement as claimed in claim 1, wherein winding directions of the measuring coils (6, 7) and of the compensating coils (11, 12, 13, 14) correspond.

10. The measuring arrangement (1) for contactless electric current measurement as claimed in claim 1, wherein at least one of the measuring coils (6, 7) or the compensating coils (11, 12, 13, 14) are embodied as air coils.

11. The measuring arrangement (1) for contactless electric current measurement as claimed in claim 1, wherein at least one of the measuring coil arrangement (2) or the compensating coil arrangement (3) define at least one of a fork-shaped or rigid electric conductor receptacle (8) for an electric conductor to be measured.

12. The measuring arrangement (1) for contactless electric current measurement as claimed in claim 11, wherein at least one of the measuring coil arrangement (2) or the compensating coil arrangement (3) are arranged in a spatially mirror-symmetric manner, and the measuring coil arrangement (2) and the compensating coil arrangement (3) are matched such that a sum of magnetic flux in the measuring coils (6, 7) and in the compensating coils (11, 12, 13, 14) equals zero for the electric conductor lying outside of the electric conductor receptacle (8).

13. The measuring arrangement (1) for contactless electric current measurement as claimed in claim 1, further comprising a measuring error recognition device (31) configured to compare, firstly, signals from at least one of the first measuring coil (6) or the second measuring coil (7) with, secondly, the common signal of the measuring coil arrangement (2) and the compensating coil arrangement (3), and to output a measuring error notification if the common signal is less than the signal from at least one of the first measuring coil (6) or the second measuring coil (7).

14. The measuring arrangement (1) for contactless electric current measurement as claimed in claim 1, further comprising an activation apparatus (32) configured to detect a signal of at least one of the measuring coil arrangement (2) or of the compensating coil arrangement (3) and to activate a further component for at least one of processing or outputting a measured value of the measuring coil arrangement (2) if the signal satisfies a stored criterion.

15. The measuring arrangement (1) for contactless electric current measurement as claimed in claim 1, further comprising a measuring range switching device (33) configured to switch from processing the common signal of the measuring coil arrangement (2) and the compensating coil arrangement (3) to only processing the signal from the measuring coil arrangement (2) when the signal exceeds a threshold.

16. A measuring arrangement (1) for contactless electric current measurement, comprising:
- a measuring coil arrangement (2) having a first measuring coil (6) and a second measuring coil (7),
- a compensating coil arrangement (3) having a first compensating coil (11) connected to one end of the first measuring coil (6) and a second compensating coil (13) connected to one end of the second measuring coil (7),
- a first detection device (4) that detects common signals from the first and second measuring coils (6, 7) of the measuring coil arrangement (2) and the first and second compensating coils (11, 13) of the compensating coil arrangement (3),
- a second detection device (5) that separately detects a signal of the first measuring coil (6) of the measuring coil arrangement (2),
- an electric conductor receptacle (8),
- the first and second measuring coils are located on mutually opposite sides (35, 36) of the electric conductor receptacle (8), and
- a third detection device (23), wherein a signal of the first measuring coil (6) of the measuring coil arrangement (2) is detectable by the second detection device (5) and a signal of the second measuring coil (7) of the measuring coil arrangement (2) is detectable by the third detection device (23).

* * * * *